(12) United States Patent
Chiu et al.

(10) Patent No.: US 10,347,756 B2
(45) Date of Patent: Jul. 9, 2019

(54) HIGH-VOLTAGE METAL-OXIDE-SEMICONDUCTOR TRANSISTOR CAPABLE OF PREVENTING OCCURRENCE OF EXCEEDINGLY-LARGE REVERSE CURRENT

(71) Applicant: Leadtrend Technology Corporation, Zhubei, Hsinchu County (TW)

(72) Inventors: Kuo-Chin Chiu, Zhubei (TW); Cheng-Sheng Kao, Zhubei (TW)

(73) Assignee: LEADTREND TECHNOLOGY CORPORATION, Zhubei, Hsinchu County (TW)

( * ) Notice: Subject to any disclaimer, the term of this patent is extended or adjusted under 35 U.S.C. 154(b) by 0 days.

(21) Appl. No.: 15/854,913

(22) Filed: Dec. 27, 2017

(65) Prior Publication Data
US 2018/0190808 A1 Jul. 5, 2018

(30) Foreign Application Priority Data
Jan. 3, 2017 (TW) .............................. 106100043 A

(51) Int. Cl.
| | |
|---|---|
| *H01L 29/78* | (2006.01) |
| *H01L 27/06* | (2006.01) |
| *H01L 27/07* | (2006.01) |
| *H01L 29/66* | (2006.01) |
| *H01L 21/82* | (2006.01) |
| *H01L 21/33* | (2006.01) |
| *H01L 29/10* | (2006.01) |
| *H02M 1/08* | (2006.01) |

(Continued)

(52) U.S. Cl.
CPC ........ *H01L 29/782* (2013.01); *H01L 29/1095* (2013.01); *H01L 29/408* (2013.01); *H01L 29/7835* (2013.01); *H01L 29/7839* (2013.01); *H02M 1/08* (2013.01); *H02M 7/217* (2013.01); *H01L 29/402* (2013.01); *H01L 29/42368* (2013.01)

(58) Field of Classification Search
CPC . H01L 29/782; H01L 29/1095; H01L 29/402; H01L 29/408; H02M 1/08; H02M 7/217
USPC ..... 327/108–112, 379, 389, 391; 326/22–27, 326/81–87
See application file for complete search history.

(56) References Cited

U.S. PATENT DOCUMENTS

| | | | | |
|---|---|---|---|---|
| 4,811,065 A | * | 3/1989 | Cogan ................. | H01L 27/0727 257/328 |
| 6,049,108 A | * | 4/2000 | Williams ............ | H01L 27/0255 257/341 |

(Continued)

FOREIGN PATENT DOCUMENTS

| | | |
|---|---|---|
| TW | I288470 B | 10/2007 |
| TW | I521703 A | 7/2013 |

*Primary Examiner* — Brandon S Cole
(74) *Attorney, Agent, or Firm* — McClure, Qualey & Rodack, LLP

(57) ABSTRACT

An embodiment of the invention shows a high-voltage MOS field-effect transistor connected in series with a Schottky diode. When the Schottky diode is forwardly biased, the high-voltage MOSFET can act as a switch and sustain a high drain-to-source voltage. When the Schottky diode is reversely biased, the Schottky diode can protect the integrate circuit where the high-voltage MOSFET is formed, because the integrate circuit might otherwise burn out due to an exceedingly-large reverse current.

14 Claims, 3 Drawing Sheets

(51) Int. Cl.
*H02M 7/217* (2006.01)
*H01L 29/40* (2006.01)
*H01L 29/423* (2006.01)

(56) References Cited

U.S. PATENT DOCUMENTS

| | | | | |
|---|---|---|---|---|
| 6,552,390 | B2* | 4/2003 | Kameda | H01L 29/7835 257/335 |
| 6,825,531 | B1* | 11/2004 | Mallikarjunaswamy | H01L 29/66681 257/343 |
| 7,064,407 | B1* | 6/2006 | Mallikarjunaswamy | H01L 27/0727 257/287 |
| 7,808,223 | B1* | 10/2010 | Khanna | H02M 3/1584 257/133 |
| 8,853,846 | B2* | 10/2014 | Shiraishi | H01L 23/3107 257/678 |
| 2010/0295515 | A1* | 11/2010 | Chiu | H01L 27/0727 320/163 |
| 2011/0284948 | A1* | 11/2011 | Higashida | H01L 29/47 257/329 |
| 2012/0037955 | A1* | 2/2012 | Hirler | H01L 21/26506 257/140 |
| 2012/0273878 | A1* | 11/2012 | Mallikarjunaswamy | H01L 29/4175 257/335 |
| 2013/0146973 | A1* | 6/2013 | Mitra | H01L 29/7835 257/335 |

* cited by examiner

HIGH-VOLTAGE METAL-OXIDE-SEMICONDUCTOR TRANSISTOR CAPABLE OF PREVENTING OCCURRENCE OF EXCEEDINGLY-LARGE REVERSE CURRENT

CROSS-REFERENCE TO RELATED APPLICATION

This application claims priority to and the benefit of Taiwan Application Series Number 106100043 filed on Jan. 3, 2017, which is incorporated by reference in its entirety.

BACKGROUND

The present disclosure relates generally to a high-voltage metal-oxide-semiconductor (MOS) transistor, and more particularly, to a high-voltage MOS transistor integrating a laterally-diffused MOS (LDMOS) transistor and a Schottky diode.

A high-voltage MOS transistor refers normally to a semiconductor device capable of sustaining a drain-to-source voltage higher than 5 volt. It can be used for load switch, voltage conversion in power management, or power amplification.

High-voltage MOS transistors commonly have high drain-to-source breakdown voltages. Based upon different application requirements, high-voltage MOS transistors might be required to have some specific ratings. A high-voltage MOS transistor might have, for example, very low gate-to-source capacitance, suitable for high speed operation.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The invention can be more fully understood by the subsequent detailed description and examples with references made to the accompanying drawings, wherein.

DETAILED DESCRIPTION

An embodiment of the invention shows a high-voltage MOS field-effect transistor (MOSFET) capable of sustaining a drain-to-source voltage higher than 5 volt. The high-voltage LDMOS transistor and a Schottky diode connected in series. When the Schottky diode is forwardly biased, the high-voltage MOSFET can act as a switch and sustain a high drain-to-source voltage. When the Schottky diode is reversely biased, the Schottky diode can protect the integrate circuit where the high-voltage MOSFET is formed, because the integrate circuit might otherwise burn out due to an exceedingly-large reverse current.

Figure 1A:
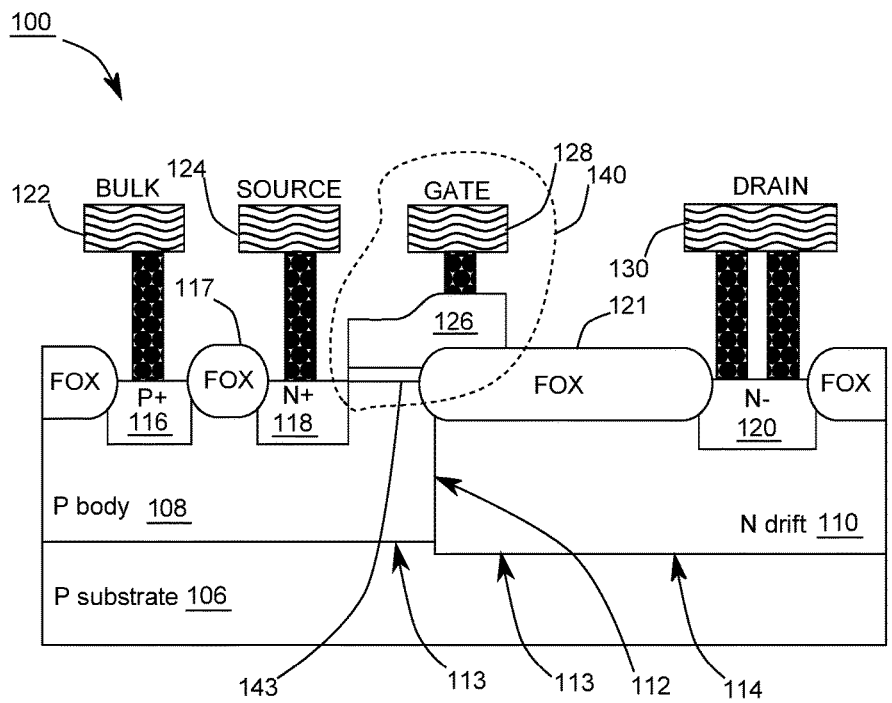
FIGS. 1A and 1B show a cross-sectional view and an equivalent circuit of a high-voltage MOSFET according to an embodiment of the invention, respectively.
Figure 1B:
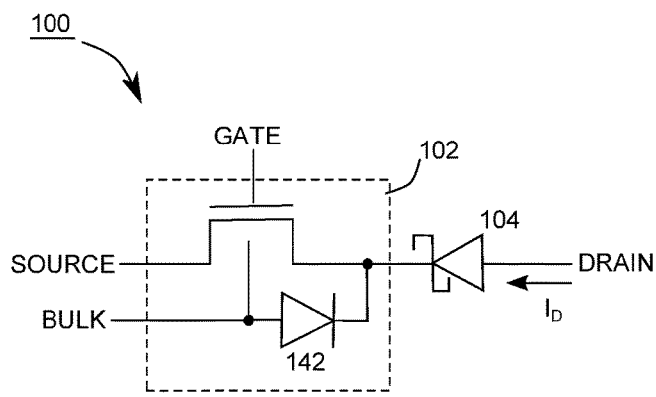

FIGS. 1A and 1B show a cross-sectional view and an equivalent circuit of high-voltage MOSFET 100 according to an embodiment of the invention, respectively. Shown by the equivalent circuit in FIG. 1B, high-voltage MOSFET 100 integrates LDMOS transistor 102 and Schottky diode 104 connected in series. LDMOS transistor 102 has a parasitic diode 142 connected between BULK node and the cathode of Schottky diode 104.

As demonstrated in FIG. 1A, high-voltage MOSFET 100 has P-type semiconductor substrate 106 having an upper surface 113. Formed directly on the upper surface 113 of P-type semiconductor substrate 106 are P-type body region 108 and N-type drift region 110. P-type body region 108 directly contacts P-type semiconductor substrate 106, so they electrically short to each other. A P-type semiconductor is a type of semiconductor that has more hole than electron. An N-type semiconductor, in the opposite, is another type of semiconductor that has more electron than hole.

P-type body region 108 adjoins N-type drift region 110, forming PN junction 112 therebetween. Another PN junction 114 is formed in the interface between N-type drift region 110 and P-type semiconductor substrate 106. PN junctions 112 and 114 in combination could perform the parasitic diode 142 in FIG. 1B.

Inside P-type body region 108 are P-type heavily-doped region 116 and N-type heavily-doped region 118, between which a field isolation region 117 is formed. Field isolation region 117 is made of silicon oxide, for example. N-type heavily-doped region 118 adjoins P-type body region 108 to form a PN junction. According to another embodiment of the invention, field isolation region 117 is omitted and P-type heavily-doped region 116 adjoins N-type heavily-doped region 118.

Inside N-type drift region 110 is N-type slightly-doped region 120. Field isolation region 121 is formed on a surface of N-type drift region 110 and between N-type slightly-doped region 120 and P-type body region 108. Field isolation regions 117, 121 and the like are formed by the same manufacture process flow, and substantially share a common thickness.

According to the embodiment shown in FIG. 1A, each of metal electrodes 122, 124, 128 and 130 has a flat metal layer and at least one contact plug. Metal electrodes 122, 124 and 130 contact, via their own contact plugs, P-type heavily-doped region 116, N-type heavily-doped region 118 and N-type slightly-doped region 120 respectively. An ohmic contact, which provides no rectification, is formed between metal electrodes 122 and P-type heavily-doped region 116, and another between metal electrodes 124 and N-type heavily-doped region 118. A Schottky contact, which provides rectification, is nevertheless formed between metal electrode 130 and N-type slightly-doped region 120. Anode and cathode of the Schottky contact are metal electrode 130 and N-type slightly-doped region 120 respectively. In one embodiment of the invention, current from metal electrode 130 flows to N-type drift region 110 by way of only one or more Schottky contacts, and no ohmic contact formed by adjoining metal to semiconductor electrically connects metal electrode 130 to N-type drift region 110.

N-type slightly-doped region 120 could be absent according to another embodiment of the invention, and a Schottky contact is therefore formed between metal electrode 130 and N-type drift region 110.

Control gate structure 140 has gate electrode 128, polysilicon conductive layer 126, and gate isolation layer 143.

Control gate structure 140 is capable of controlling the electric connection between N-type drift region 110 and N-type heavily-doped region 118. Gate electrode 128 has a flat metal layer and a contact plug, both shorting to poly-silicon conductive layer 126. Part of polysilicon conductive layer 126 is above field isolation region 121, acting as a field plate to lessen the maximum electric field inside N-type drift region 110, so as to make LDMOS transistor 102 have a higher drain-to-source breakdown voltage. Gate isolation layer 143, probably formed by deposition or oxidation, extends from field isolation region 121 and is positioned between polysilicon conductive layer 126 and body region 108. Gate isolation layer 143 can prevent polysilicon conductive layer 126 shorting to P-type body region 108 and N-type heavily-doped region 118.

In view of N-type impurity dosage concentration, N-type heavily-doped region 118 is heavier than N-type slightly-doped region 120, which is heavier than N-type drift region 110. In view of P-type impurity dosage concentration, P-type heavily-doped region 116 is heavier than P-type body region 108, which is heavier than P-type semiconductor substrate 106.

The cross-sectional view in FIG. 1A also shows LDMOS transistor 102, whose gate, source, body, and drain are gate electrode 128, metal electrode 124, metal electrode 122, and N-type drift region 110, respectively. Metal electrode 130 and N-type slightly-doped region 120 adjoin to form Schottky contact, acting as Schottky diode 104. For N-type slightly-doped region 120 shorts to N-type drift region 110, LDMOS transistor 102 and Schottky diode 104 are connected in series, as demonstrated by the equivalent circuit in FIG. 1B. Between the cathode of Schottky diode 104 and N-type drift region 110 has no ohmic contact, which is a junction between metal and semiconductor and provides electric connection without rectification. Gate electrodes 128, 124, 122 and 130 are marked to be GATE, SOURCE, BULK and DRAIN nodes respectively, as shown in FIG. 1A.

Figure 2:
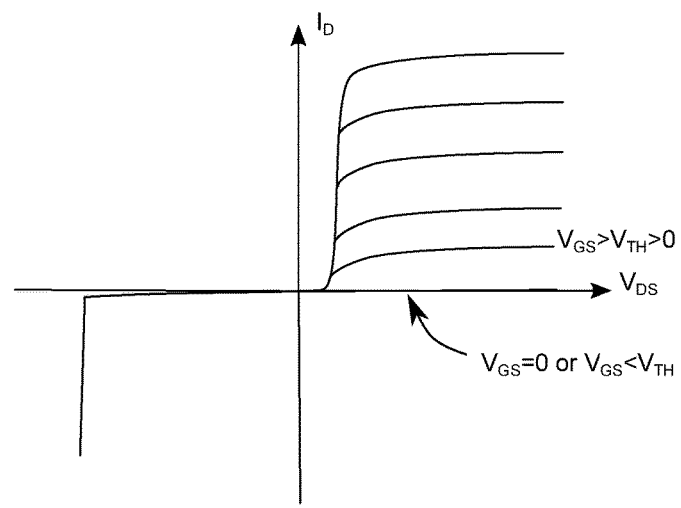
FIG. 2 shows the current-to-voltage (IV) curves of the high-voltage MOSFET in FIGS. 1A and 1B.

FIG. 2 shows the current-to-voltage (IV) curves of high-voltage MOSFET 100, where drain-to-source voltage $V_{DS}$ represents the voltage drop from DRAIN node to SOURCE node, gate-to-source voltage $V_{GS}$ the voltage drop from GATE node to SOURCE node, and current $I_D$ the current entering from DRAIN node into high-voltage MOSFET 100.

When drain-to-source voltage $V_{DS}$ is negative, Schottky diode 104 is reversely biased, so it could prevent the parasitic diode 142 from conducting an exceedingly-large reverse current. This prevention provided by Schottky diode 104 fails if drain-to-source voltage $V_{DS}$ is exceedingly negative and the Schottky contact of Schottky diode 104 breaks down. When drain-to-source voltage $V_{DS}$ is positive, Schottky diode 104 is forwardly biased, the IV curves of high-voltage MOSFET 100 substantially fit those of a LDMOS transistor, except that drain-to-source voltage $V_{DS}$ need additionally overcome the forward voltage of Schottky diode 104 to conduct current. LDMOS transistor 102 is an enhancement-mode MOS transistor. When the gate-to-drain voltage $V_{GS}$ is 0 volt, high-voltage MOSFET 100 is OFF and the current $I_D$ is about 0 A. When gate-to-drain voltage $V_{GS}$ exceeds a positive threshold voltage $V_{TH}$, high-voltage MOSFET 100 is ON and the current $I_D$ can become considerably positive, as shown in FIG. 2.

Figure 3:
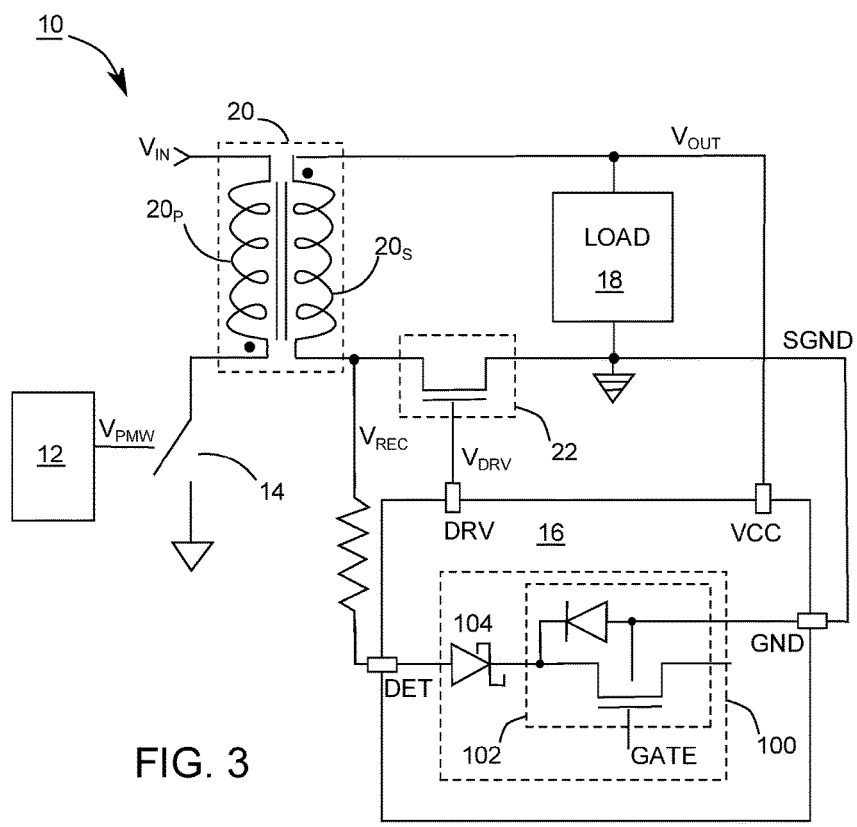
FIG. 3 shows a flyback power supply according to embodiments of the invention.

FIG. 3 shows flyback power supply 10 according to embodiments of the invention. Power supply 10 converts input power voltage $V_{IN}$ into output power voltage $V_{OUT}$ to power load 18. Power supply 10 has transformer 20 with primary winding $20_P$ and secondary winding $20_S$, both inductively coupled to each other. At the primary side, power controller 12 provides pulse-width modulation (PWM) signal $V_{PWM}$ to turn ON and OFF power switch 14, which is connected in series to primary winding $20_P$. At the secondary side, secondary winding $20_S$ and synchronous rectification (SR) switch 22 are connected in series between output power voltage $V_{OUT}$ and output power ground SGND, where SR controller 16 controls SR switch 22.

According to embodiments of the invention, SR controller 16 is a packaged integrated circuit with drive pin DRV coupled to SR switch 22. By providing drive signal $V_{DRV}$ to SR switch 22, SR controller 16 turns ON and OFF SR switch 22, controlling electric connection between secondary winding $20_S$ and output power ground SGND. SR controller 16 further has detection pin DET coupled to the joint between secondary winding $20_S$ and SR switch 22. Through detection pin DET, SR controller 16 detects voltage drop $V_{REC}$ across the conductive channel of SR switch 22.

SR controller 16 has high-voltage MOSFET 100 shown in FIGS. 1A and 1B, where the DRAIN node of high-voltage MOSFET 100 is connected to detection pin DET, and the BULK node to output power ground SGND via a ground pin GND of SR controller 16.

Figure 4:
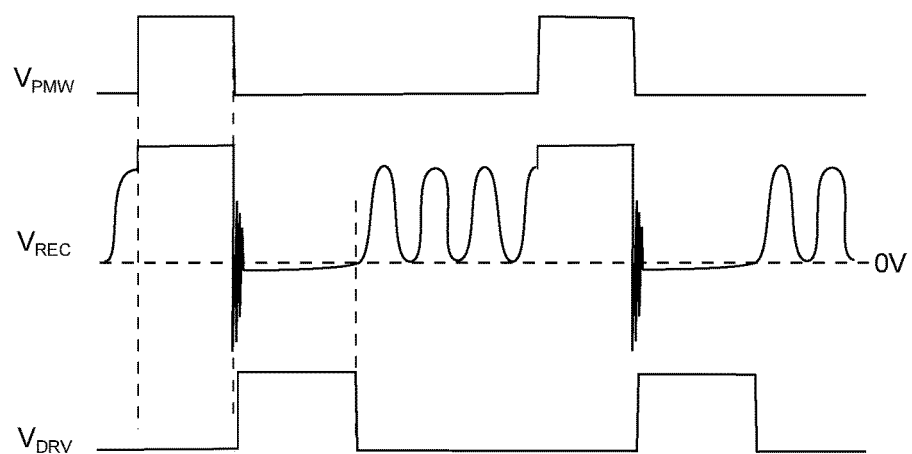
FIG. 4 shows waveforms of PWM signal $V_{PWM}$, voltage drop $V_{REC}$ and drive signal $V_{DRV}$.

FIG. 4 shows waveforms of PWM signal $V_{PWM}$, voltage drop $V_{REC}$ and drive signal $V_{DRV}$. In response to a falling edge of PWM signal $V_{PWM}$, power switch 14 is turned OFF and voltage drop $V_{REC}$ becomes negative. When SR controller 16 finds from detection pin DET that voltage drop $V_{REC}$ is negative in reference to output power ground SGND, SR controller 16 sends drive signal $V_{DRV}$ to turn ON SR switch 22.

Because of the resonant tank consisting of the leakage inductance of primary winding $20_P$ and the parasitic capacitance of power switch 14, voltage drop $V_{REC}$ oscillates harshly and temporarily right after power switch 14 is turned OFF, and the amplitude of this oscillation might be as large as 10 volt, making the detection pin DET possibly confront a negative voltage stress as low as −10 volt. This negative voltage stress, if there were no Schottky diode 104 in high-voltage MOSFET 100, could make the parasitic diode 142 forward biased to conduct an exceedingly-large reverse current, which possibly burns out LDMOS 102. In other words, Schottky diode 104 could protect LDMOS 102 by way of preventing the occurrence of the exceedingly-large reverse current.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage semiconductor device with a Schottky diode, comprising:

a semiconductor substrate having an upper surface;

a body region of a first type, formed directly on the upper surface of the semiconductor substrate;

a drift region of a second type, formed directly on the upper surface of the semiconductor substrate, wherein the second type is opposite to the first type, and the drift region adjoins the body region to form a first junction therebetween;

a first metal electrode, positioned on the drift region to form a Schottky contact as the Schottky diode;

a first heavily-doped region of the second type, formed in the body region;
a second metal electrode, positioned on the first heavily-doped region to form an ohmic contact; and
a control gate structure comprising a gate electrode capable of controlling electric connection between the drift region and the first heavily-doped region;
wherein the semiconductor substrate contacts and shorts substantially to the body region; and
in view of second-type impurity dosage concentration, the first heavily-doped region is heavier than the drift region.

2. The high-voltage semiconductor device as claimed in claim 1, wherein the high-voltage semiconductor device comprises a lateral-diffusion metal-oxide-semiconductor transistor connected in series with the Schottky diode, the second metal electrode is a source of the lateral-diffusion metal-oxide-semiconductor transistor, and the drift region is a drain of the lateral-diffusion metal-oxide-semiconductor transistor.

3. The high-voltage semiconductor device as claimed in claim 2, wherein the lateral-diffusion metal-oxide-semiconductor transistor is an enhancement-mode device.

4. The high-voltage semiconductor device as claimed in claim 1, further comprising a field isolation region formed between the Schottky contact and the first junction.

5. The high-voltage semiconductor device as claimed in claim 4, wherein the control gate structure comprises:
a polysilicon conductive layer, partially positioned on the filed isolation region; and
a gate isolation layer, extending from the field isolation region and positioned between the polysilicon conductive layer and the body region, for preventing the polysilicon conductive layer from shorting to the body region.

6. The high-voltage semiconductor device as claimed in claim 1, further comprising:
a slightly-doped region of the second type, formed in the drift region, wherein the first metal electrode contacts the slightly-doped region to form the Schottky contact;
wherein in view of second-type impurity dosage concentration, the first heavily-doped region is heavier than the slightly-doped region, and the slightly-doped region is heavier than the drift region.

7. A synchronous rectification controller in a form of an integrated circuit, for use in a power supply comprising a transformer and a synchronous rectification switch, wherein the transformer includes a primary winding and a secondary winding inductively coupled to each other, and the synchronous rectification switch and the secondary winding are connected in series, the synchronous rectification controller comprising:
a drive pin, for being coupled to the synchronous rectification switch, through which the synchronous rectification controller controls electric connection between the secondary winding and a power line;
a detection pin, for being coupled to a joint connecting the secondary winding to the synchronous rectification switch; and
a high-voltage semiconductor device with a Schottky diode, comprising:
a semiconductor substrate;
a body region of a first type, formed on the semiconductor substrate;
a drift region of a second type, formed on the semiconductor substrate, wherenin the second type is opposite to the first type, and the drift region adjoins the body region to form a first junction therebetween;
a first metal electrode, positioned on the drift region to form a Schottky contact as the Schottky diode;
a first heavily-doped region of the second type, formed in the body region;
a second metal electrode, positioned on the first heavily-doped region to form an ohmic contact; and
a control gate structure comprising a gate electrode capable of controlling electric connection between the drift region and the first heavily-doped region;
wherein the semiconductor substrate shorts substantially to the body region;
in view of second-type impurity dosage concentration, the first heavily-doped region is heavier than the drift region;
the detection pin is electrically connected to the first metal electrode; and
the body region is electrically connected to the power line.

8. The synchronous rectification controller as claimed in claim 7, wherein the high-voltage semiconductor device comprises a lateral-diffusion metal-oxide-semiconductor transistor connected in series with the Schottky diode, the second metal electrode is a source of the lateral-diffusion metal-oxide-semiconductor transistor, and the drift region is a drain of the lateral-diffusion metal-oxide-semiconductor transistor.

9. The synchronous rectification controller as claimed in claim 8, wherein the lateral-diffusion metal-oxide-semiconductor transistor is an enhancement-mode device.

10. The synchronous rectification controller as claimed in claim 7, further comprising a field isolation region formed between the Schottky contact and the first junction.

11. The synchronous rectification controller as claimed in claim 10, wherein the control gate structure comprises:
a polysilicon conductive layer, partially positioned on the filed isolation region; and
a gate isolation layer, extending from the field isolation region and positioned between the polysilicon conductive layer and the body region, for preventing the polysilicon conductive layer from shorting to the body region.

12. The synchronous rectification controller as claimed in claim 7, further comprising:
a slightly-doped region of the second type, formed in the drift region, wherein the first metal electrode contacts the slightly-doped region to form the Schottky contact;
wherein in view of second-type impurity dosage concentration, the first heavily-doped region is heavier than the slightly-doped region, and the slightly-doped region is heavier than the drift region.

13. The synchronous rectification controller as claimed in claim 7, wherein the synchronous rectification controller turns ON the synchronous rectification switch to connect the secondary winding to the power line in response to detection of a negative voltage at the joint.

14. The high-voltage semiconductor device as claimed in claim 1, wherein the first metal electrode contacts the drift region to form the Schottky contact.

* * * * *